United States Patent
Smith et al.

(10) Patent No.: US 6,259,260 B1
(45) Date of Patent: Jul. 10, 2001

(54) APPARATUS FOR COUPLING A TEST HEAD AND PROBE CARD IN A WAFER TESTING SYSTEM

(75) Inventors: Douglas W. Smith, Portola Valley; Thornton W. Sargent, IV, Redwood City, both of CA (US)

(73) Assignee: InTest IP Corporation, Wilmington, DE (US)

( * ) Notice: Subject to any disclaimer, the term of this patent is extended or adjusted under 35 U.S.C. 154(b) by 0 days.

(21) Appl. No.: 09/126,267

(22) Filed: Jul. 30, 1998

(51) Int. Cl.[7] .................................................. G01R 1/073
(52) U.S. Cl. ........................ 324/754; 324/158.1; 324/756
(58) Field of Search ................................... 324/754, 755, 324/758, 765, 158.1

(56) References Cited

U.S. PATENT DOCUMENTS

| | | | |
|---|---|---|---|
| 3,731,191 | * 5/1973 | Bullard et al. | 324/158.1 |
| 3,968,433 | * 7/1976 | Dobarganes | 324/158.1 |
| 4,668,041 | 5/1987 | La Komski et al. . | |
| 4,967,147 | 10/1990 | Woods, Jr. et al. | 324/158 |
| 5,081,415 | 1/1992 | Liu et al. | 324/158 |
| 5,451,883 | 9/1995 | Staab | 324/758 |
| 5,461,327 | 10/1995 | Shibata et al. | 324/760 |
| 5,546,405 | 8/1996 | Golla | 371/22.1 |
| 5,594,357 | 1/1997 | Nakajima | 324/758 |
| 5,635,846 | 6/1997 | Beaman et al. . | |
| 5,656,943 | 8/1997 | Montoya et al. | 324/754 |
| 5,923,178 | * 7/1999 | Higgins et al. | 324/754 |

FOREIGN PATENT DOCUMENTS 0 283 219    9/1988   (EP) .

* cited by examiner

Primary Examiner—Safet Metjahic
Assistant Examiner—Jimmy Nguyen
(74) Attorney, Agent, or Firm—Ratner & Prestia

(57) ABSTRACT

An apparatus for coupling a test head and probe card in a wafer testing system incorporates a number of features that contribute to low impedance and reduced cross-talk, making the coupling apparatus particularly advantageous for high-speed test applications. The coupling apparatus may include, for example, an array of discrete conductor conduits that contain individual conducting elements. The conduits can be insulated, if desired, to reduce leakage. Further, the conduits can be made from metal, and terminated in dielectric interface plates for improved impedance matching. Divider elements can be provided to physically and electrically isolate adjacent rows of conductor conduits. Also, adjacent conducting elements can be connected to carry ground and signal potentials in an alternating manner such that signal carrying elements in a common row are separated from one another by ground carrying elements.

28 Claims, 1 Drawing Sheet

US 6,259,260 B1

APPARATUS FOR COUPLING A TEST HEAD AND PROBE CARD IN A WAFER TESTING SYSTEM

TECHNICAL FIELD

The present invention relates to wafer testing systems and, more particularly, to devices for coupling a test head and a probe card in a wafer testing system.

BACKGROUND INFORMATION

Wafer testing systems typically include a test head and a probe card. The probe card includes a pattern of contacts for electrically probing portions of an integrated circuit formed on a semiconductor wafer. The test head is configured to drive various contacts of the probe card to carry out particular test procedures within the integrated circuit. In the course of a test procedure, the test head receives output signals from the integrated circuit via the contacts of the probe card. The output signals are indicative of electrical characteristics of the integrated circuit under test. The probe card and test head are uniquely configured for a particular integrated circuit and, in some cases, a particular test procedure. Accordingly, the probe card and/or test head must be changed for different integrated circuits and test procedures.

The test head and probe card are electrically coupled to one another with a coupling apparatus often referred to as a "pogo" unit. The pogo unit engages the test head, or some intermediate coupling structure associated with the test head, and the probe card. The pogo unit includes an array of spring-loaded contacts referred to as pogo pins. The pogo pins are arranged to electrically couple contacts on the probe card to corresponding contacts on the test card. The spring force of the pogo pins helps maintain uniformity of electrical contact between the various contacts of the probe card and test head. When the test head and probe card are engaged with the pogo unit to exert pressure against the pogo pins, the pins respond with a spring force that enhances coupling pressure. The resilience of the pins generally ensures adequate coupling pressure despite planar deformation of the test head or probe card during a test procedure.

SUMMARY

The present invention is directed to an apparatus for coupling a test head and a probe card in a wafer testing system. The coupling apparatus incorporates a number of features that contribute to controlled impedance and reduced cross-talk. Consequently, the coupling apparatus is particularly advantageous for high-speed test applications. The coupling apparatus may include, for example, an array of discrete conductor conduits that contain individual conducting elements such as pogo pins. The conduits can be insulated, if desired, to reduce leakage. The conduits can be made from metal, and are terminated in dielectric interface plates for improved impedance matching. Divider elements can be provided to physically and electrically isolate adjacent rows of conductor conduits. Also, adjacent conducting elements can be connected to carry ground and signal potentials in an alternating manner such that signal carrying elements in a common row are separated from one another by ground carrying elements.

In one embodiment, the present invention provides an apparatus for coupling a test head and a probe card in a wafer testing system, the apparatus comprising a first plate having first sockets, a second plate having second sockets, conduits extending between the first plate and the second plate, each of the conduits having a first end mounted at one of the first contacts and a second end mounted at one of the second contacts, and electrical conducting members disposed within the conduits, each of the conducting members having a first end accessible via one of the first sockets and a second end accessible via one of the second sockets.

In another embodiment, the present invention provides an apparatus for coupling a test head coupling structure and a probe card coupling structure in a wafer testing system, the apparatus comprising a first dielectric plate having first sockets, a second dielectric plate having second sockets, metal conduits extending between the first plate and the second plate, each of the conduits having a first end mounted at one of the first sockets and a second end mounted at one of the second sockets, wherein the elongated conduits are generally arranged in rows, electrical shielding members disposed between adjacent rows of the conduits, thereby reducing electrical cross-talk, and electrical conducting members disposed within the conduits, each of the electrical conducting members having a first end accessible via one of the first sockets and a second end accessible via one of the second sockets.

In a further embodiment, the present invention provides an apparatus for coupling a test head coupling structure and a probe card coupling structure in a wafer testing system, the apparatus comprising a first dielectric plate having first sockets, a second dielectric plate having second sockets, conduits extending between the first plate and the second plate, each of the conduits having a first end mounted within one of the first sockets and a second end mounted within one of the second sockets, wherein the conduits are generally arranged in rows, electrical conducting members disposed within the conduits, each of the electrical conducting members having a first end accessible via one of the first sockets and a second end accessible via one of the second sockets, wherein alternating conducting members in each row of conduits carry a common ground signal and the conducting members between the alternating conducting members carry data signals, thereby reducing electrical cross-talk, and electrical shielding members disposed between adjacent rows of the conduits, thereby reducing electrical cross-talk.

In an added embodiment, the present invention provides a wafer testing apparatus comprising a test head coupling structure having first pins, a probe card coupling structure having second pins, a first plate having first sockets receiving the first pins, a second plate having second sockets receiving the second pins, conduits extending between the first plate and the second plate, each of the conduits having a first end mounted at one of the first contacts and a second end mounted at one of the second contacts, electrical conducting members disposed within the conduits, each of the conducting members having a first end accessible by one of the first pins via one of the first sockets and a second end accessible by one of the second pins via one of the second sockets, some of the first pins thereby being electrically coupled to at least some of the second pins.

Other advantages, features, and embodiments of the present invention will become apparent from the following detailed description and claims.

DETAILED DESCRIPTION

Figure 1:
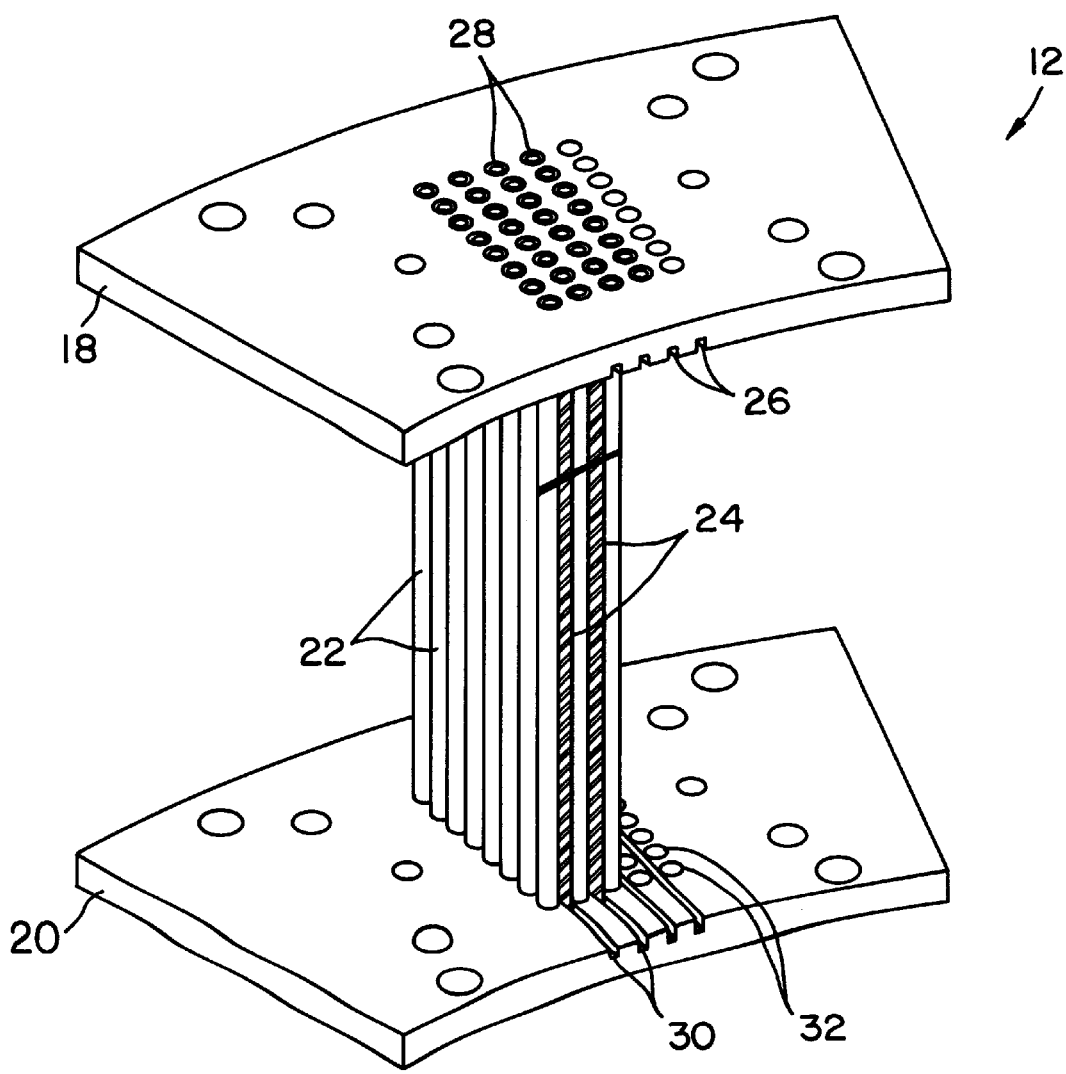
FIG. 1 is a perspective diagram of a section of a coupling apparatus for a wafer testing tool.

FIG. 1 is a perspective diagram of a section of a coupling apparatus 12 in accordance with an embodiment of the present invention. Coupling apparatus 12 may be incorporated in a wafer testing apparatus having a test head and a probe card useful in wafer test procedures. Coupling apparatus 12 couples the test head to the probe card. Apparatus 12 can be directly coupled between the test head and probe card. Alternatively, the test head and/or probe card may be equipped with intermediate coupling structures that interface with coupling apparatus 12. As shown in FIG. 1, apparatus 12 includes a first plate 18, a second plate 20, conduits 22, and dividing elements 24. First plate 18 is disposed adjacent the test head, whereas second plate 20 is disposed adjacent the probe card. Conduits 22 and dividing elements 24 extend between first and second plates 18, 20. Conduits 22 are generally elongated and tubular and may be, for example, circular or rectangular in cross-section. Each conduit 22 contains a spring-loaded conducting element, such as the type commonly referred to as a pogo pin. As an alternative, conduit 22 could accommodate a pin-and-socket connector. The conducting element electrically couples a contact associated with the test head to a corresponding contact associated with the probe card. The contacts associated with the test head and probe card may comprise pins.

First plate 18 includes first grooves 26 and first sockets 28. Similarly, second plate 20 includes second grooves 30 and second sockets 32. Sockets 28, 32 are formed by apertures that extend through first and second plates 18, 20, respectively. Each conduit 22 includes a first end mounted at a first socket 28 and a second end mounted at a second socket 32. Conduits 22 preferably are mounted within the apertures formed by first and second sockets 28, 32. A solder or adhesive bond, or friction fit, can be used to secure conduits 22 within sockets 28, 32. For a solder connection, sockets 28, 32 may include a conductive trace disposed about the aperture. Grooves 26, 30 extend transversely across first and second plates 18, 20, respectively. Each dividing element 24 is generally planar, and has a first end mounted within a first groove 26 and a second end mounted within a second groove 28. Dividing elements 24 can be mounted within grooves 26, 30 with, for example, an adhesive bond or a friction fit.

First and second plates 18, 20 preferably are annular, forming a ring-like structure. Each ring may be substantially circular or rectangular in shape. Sockets 28, 32 can be arranged in any desired pattern consistent with the interface requirements of a particular set of test heads and probe cards. In other words, sockets 28, 32 are arranged to receive a corresponding pattern of pins from a test head and probe card, respectively. The pins associated with a test head and probe card extend into sockets 28,32 to engage opposite ends of the conducting member disposed in a respective conduit 22. As shown in FIG. 1, sockets 28, 32 may be arranged in a generally orthogonal pattern of rows. Alternatively, sockets 28, 32 may be arranged in a generally radial pattern of rows such that the rows extend generally along radii of the ring-like plate. In either case, the orientation of grooves 26, 30 preferably conforms to the selected socket pattern such that the grooves separate adjacent rows of sockets 28, 32 from one another. Grooves 26, 30 and sockets 28, 32 can be distributed continuously or in discrete sections about the annular rings formed by plates 18, 20.

A conducting element contained within a conduit 22 in coupling apparatus 12 may include a first pin section, a second pin section, and a spring portion. The pin sections extend into sockets 28, 32, respectively. Upon engagement of plates 18, 20 with a test head and probe card, conductive pins associated with the test head and probe card, or some intermediate connector structure, extend into sockets 28, 32. The pins associated with a test head and probe card thereby engage the respective pin sections. With the spring portion, the conducting element is resiliently compressible. In other words, in response to pressure exerted against the first and second pin sections by the respective contacts, the spring portion exerts an opposite spring force. In this manner, the conducting element enhances coupling pressure with corresponding pins associated with a test head and probe card. Consequently, planar deformation of a test head and probe card is less likely to cause contact nonuniformity across the pins. The conducting element thereby electrically couples the contacts associated with a test head and a probe card via the first and second pin sections.

Coupling apparatus assembly 12 incorporates a number of features that contribute to controlled impedance and reduced cross-talk between the conducting elements. Insulating material can be applied to the exterior of conduits 22 to reduce leakage or further control impedance. Conduits 22 preferably are made from metal, however, for reduced impedance and effective impedance matching in cooperation with plates 18, 20. Specifically, plates 18, 20 can be formed from a dielectric material. Also, the ground circuit pattern density can be adjusted across plates 18, 20 to further control impedance. For example, the ground circuit pattern density, e.g., density of metal traces on plates 18, 20, could be adjusted radially such that pins toward the inner diameter of the plates have less ground density than those at the outer diameter.

The metal conduits 22 can be terminated in dielectric plates 18, 20 for improved impedance matching. Further, plates 18, 20 may comprise printed circuit boards that, in addition to being made from a dielectric material, include conductive traces for the interconnection of the desired conducting elements and/or the mounting of circuit elements or devices. For example, each plate 18, 20 may include traces commonly connecting various sockets 28, 32 associated with the conducting elements with power and ground potentials. Dividing elements 24 also provide additional isolation of the conducting elements. Specifically, dividing elements 24 physically separate rows of conduits 22 from one another.

Also, dividing elements 24 can be made from a metal to provide shielding between adjacent rows of conduits 22. An example of a suitable metal for use in conduits 22 and dividing elements 24 is beryllium copper. Dividing elements 24 can be coupled to any of the conduits 22, sockets 28, 32 that carry the ground potential. As a further measure, the conducting elements can be connected to carry ground and signal potentials in an alternating manner such that signal carrying elements in a common row are separated from one another by ground carrying elements.

The net result of the above features is a coupling apparatus 12 capable of achieving controlled impedance and reduced cross-talk, both of which are particularly advantageous for high-speed test applications. Also, dividing elements 24 can provide increased isolation for less cross-talk, and allow larger diameter conduits 22 for greater mechanical durability. Larger diameter conduits 22 can allow larger spring contacts that are more mechanically robust.

The foregoing detailed description has been provided for a better understanding of the invention and is for exemplary purposes only. Modifications may be apparent to those skilled in the art without deviating from the spirit and scope of the appended claims.

What is claimed is:

1. An apparatus for coupling a test head and a probe card in a wafer testing system, the apparatus comprising:

a first plate having first locations;

a second plate having second locations;

conduits extending between the first plate and the second plate, each of the conduits having a first end mounted at one of the first locations and a second end mounted at one of the second locations; and said conduits arranged in a plurality of rows of said conduits;

a first and a second conductive dividing element, each having a respective planar surface;

said first dividing element and said second dividing element situated between a first two and a second two of said plurality of rows of conduits, respectively;

said first and second dividing element each spanning across more than one of said conduits in a first direction and extending between said first plate and said second plate in a second direction orthogonal to said first direction;

wherein said planar surface of said first dividing element and said planar surface of said second dividing element being one of:

non parallel; and offset relative to each other in said first direction.

2. The apparatus of claim 1, wherein some of the conduits include an electrically insulating material.

3. The apparatus of claim 1, wherein each of the first and second plates includes a printed circuit board.

4. The apparatus of claim 1, wherein each of the first and second plates includes a dielectric material.

5. The apparatus of claim 1, wherein each of the first and second plates is substantially annular in shape.

6. The apparatus of claim 1, wherein each of the conduits is substantially cylindrically tubular.

7. The apparatus of claim 1, wherein the first location includes first sockets, the second location includes second sockets, and, wherein the first end of each of the conduits is fixed within one of the first sockets and the second end of each of the conduits is fixed within one of the second sockets.

8. The apparatus of claim 1, wherein alternating conduits are configured for coupling to a common ground potential, and some of the conduits between the alternating conduits are configured to carry data signals.

9. The apparatus of claim 1, wherein each of the first and second plates includes slots oriented substantially parallel to and disposed between the plurality of rows of said conduits, the dividing elements mounted within the slots and extending between the first and second plates to reduce electrical cross-talk between the conduits disposed in adjacent rows.

10. The apparatus of claim 1, wherein each of the conduits is resiliently compressible in response to force applied at the ends thereof.

11. The apparatus of claim 1, wherein each of the first and second plates is annular and generally circular in shape, and the rows of conducting members and sockets are arranged in a substantially radial pattern.

12. Apparatus according to claim 1, wherein said first and second dividing element are each tied to a ground.

13. Apparatus according to claim 1, wherein said first and second dividing element are both tied together to a common ground.

14. A semiconductor testing apparatus comprising:

a test head coupling structure having first electrical interconnection elements;

a probe card coupling structure having second electrical interconnection elements;

a first plate having first locations for receiving the first interconnection elements;

a second plate having second locations for receiving the second interconnection elements;

conduits extending between the first plate and the second plate, each of the conduits comprising at least one of a plurality of conducting members having a first end accessible by one of the first interconnection elements and a second end accessible by one of the second interconnection elements, some of the first interconnection elements thereby being electrically coupled to at least some of the second interconnection elements;

said conduits arranged in a plurality of rows of said conduits;

a first and a second conductive dividing element, each having a respective planar surface;

said first dividing element and said second dividing element situated between a first two and a second two of said plurality of rows of conduits, respectively;

said first and second dividing element each spanning across more than one of said conduits in a first direction and extending between said first plate and said second plate in a second direction orthogonal to said first direction;

wherein said planar surface of said first dividing element and said planar surface of said second dividing element being one of:

non parallel; and offset relative to each other in said first direction.

15. A semiconductor testing apparatus according to claim 14, wherein said first and second dividing element are each tied to a ground.

16. A semiconductor testing apparatus according to claim 14, wherein said first and second dividing element are both tied together to a common ground.

17. An apparatus for coupling a test head and a probe card in a wafer testing system, the apparatus comprising:

first plate having first locations;

a second plate having second locations;

conduits extending between the first plate and the second plate, each of the conduits comprising at least one of a plurality of conducting members having a first end accessible via one of the first locations and a second end accessible via one of the second locations said conduits arranged in a plurality of rows of said conduits;

a first and a second conductive dividing element, each having a respective planar surface;

said first dividing element and said second dividing element situated between a first two and a second two of said plurality of rows of conduits, respectively;

said first and second dividing element each spanning across more than one of said conduits in a first direction and extending between said first plate and said second plate in a second direction orthogonal to said first direction;

wherein said planar surface of said first dividing element and said planar surface of said second dividing element being one of:

non parallel; and offset relative to each other in said first direction.

18. The apparatus of claim 17 wherein the first location includes first sockets, the second location includes second sockets, and, wherein the first end of each of the conduits is fixed within one of the first sockets and the second end of each of the conduits is fixed within one of the second sockets.

19. The apparatus of claim 17, wherein alternating conduits in each row of conduits are configured for coupling to a common ground potential, and some of the conduits between the alternating conduits are configured to carry data signals.

20. The apparatus of claim 17, wherein each of the first and second plates is annular and generally circular in shape, and the rows of conducting members and sockets are arranged in a substantially radial pattern.

21. The apparatus of claim 17, wherein each of the first and second plates includes slots oriented substantially parallel to and disposed between the plurality of rows of said conduits, the dividing elements mounted within the slots and extending between the first and second plates to reduce electrical cross-talk between the conduits within the conduits disposed in adjacent rows.

22. The apparatus of claim 17, wherein each of the conduits is resiliently compressible in response to force applied at the first and second ends of the conduits.

23. The apparatus of claim 17, wherein each of the first and second plates is substantially annular in shape.

24. The apparatus of claim 17, wherein some of the conduits include an electrically insulating material.

25. The apparatus of claim 17, wherein each of the first and second plates includes a printed circuit board.

26. The apparatus of claim 17, wherein each of the first and second plates includes a dielectric material.

27. Apparatus according to claim 27, wherein said first and second dividing element are each tied to a ground.

28. Apparatus according to claim 17, wherein said first and second dividing element are both tied together to a common ground.

* * * * *

UNITED STATES PATENT AND TRADEMARK OFFICE
CERTIFICATE OF CORRECTION

PATENT NO. : 6,259,260 B1
DATED : July 10, 2001
INVENTOR(S) : Smith et al.

It is certified that error appears in the above-identified patent and that said Letters Patent is hereby corrected as shown below:

<u>Column 8, claim 27,</u>
Line 1, "Apparatus according to claim 27" should read
-- Apparatus according to claim 17 --.

Signed and Sealed this

Ninth Day of April, 2002

Attest:

*Attesting Officer*

JAMES E. ROGAN
*Director of the United States Patent and Trademark Office*